(12) United States Patent
Lee et al.

(10) Patent No.: US 7,099,175 B2
(45) Date of Patent: Aug. 29, 2006

(54) SEMICONDUCTOR MEMORY INTEGRATED CIRCUIT

(75) Inventors: Jae-Hyung Lee, Suwon (KR); Jung-Bae Lee, Yongin (KR)

(73) Assignee: Samsung Electronics, Co., Ltd., (KR)

( * ) Notice: Subject to any disclaimer, the term of this patent is extended or adjusted under 35 U.S.C. 154(b) by 182 days.

(21) Appl. No.: 10/797,667

(22) Filed: Mar. 10, 2004

(65) Prior Publication Data

US 2004/0190328 A1 Sep. 30, 2004

(30) Foreign Application Priority Data

Mar. 26, 2003 (KR) ...................... 10-2003-0018991

(51) Int. Cl.
*H01L 23/48* (2006.01)
*H01L 23/02* (2006.01)
*H01L 23/03* (2006.01)

(52) U.S. Cl. ........................ 365/63; 257/693; 257/676; 257/678; 257/730; 257/786; 257/773

(58) Field of Classification Search .................. 365/63; 257/693, 676, 678, 730, 786, 773
See application file for complete search history.

(56) References Cited

U.S. PATENT DOCUMENTS

| | | | | |
|---|---|---|---|---|
| 5,559,750 A | * | 9/1996 | Dosaka et al. | 365/230.06 |
| 5,652,904 A | * | 7/1997 | Trimberger | 712/38 |
| 6,208,571 B1 | * | 3/2001 | Ikeda et al. | 365/201 |
| 6,229,726 B1 | * | 5/2001 | Wang et al. | 365/51 |
| 6,272,053 B1 | * | 8/2001 | Choi | 365/189.03 |
| 6,492,727 B1 | * | 12/2002 | Nishizawa et al. | 257/723 |
| 6,531,773 B1 | * | 3/2003 | Nishizawa et al. | 257/723 |
| 6,667,895 B1 | * | 12/2003 | Jang et al. | 365/63 |
| 6,815,621 B1 | * | 11/2004 | Park et al. | 174/260 |
| 6,867,993 B1 | * | 3/2005 | Ohshima et al. | 365/63 |
| 6,873,563 B1 | * | 3/2005 | Suwa et al. | 365/230.03 |
| 6,877,071 B1 | * | 4/2005 | Sherman | 711/149 |

FOREIGN PATENT DOCUMENTS

| | | | |
|---|---|---|---|
| JP | 410070199 A | * | 3/1998 |
| JP | 02000049250 | * | 2/2000 |

* cited by examiner

*Primary Examiner*—Viet Q. Nguyen
(74) *Attorney, Agent, or Firm*—Mills & Onello LLP (57) ABSTRACT

In a semiconductor memory integrated circuit (IC), a plurality of first data IO pads, a plurality of address and instruction pads, and a plurality of second data IO/address pads, are arranged in groups adjacent each other. Each of the plurality of the second data IO/address pads is used as a second data IO pad in response to a control signal when packaged into a first package form and is used as an address pad in response to the control signal when packaged into a second package form. The semiconductor memory IC of the present invention can selectively use a portion of pads as data IO pads or address/instruction pads, and thus the IC is compatible for use with different types of packages. The semiconductor memory IC of the present invention further allows for simplified wire bonding when it is packaged into different types of packages, and thus the possibility of failure of the semiconductor memory device is reduced.

16 Claims, 6 Drawing Sheets

SEMICONDUCTOR MEMORY INTEGRATED CIRCUIT

The U.S. nonprovisional patent application claims priority under 35 U.S.C. § 119 of Korean Patent Application 2003-18991 filed on Mar. 26, 2003, the entire content of which is hereby incorporated by reference.

BACKGROUND OF THE INVENTION

1. Field of the Invention

The present invention relates to a semiconductor memory integrated circuit(IC), and more particularly to a semiconductor memory IC in which semiconductor memory ICs having the same circuit configuration and pad arrangement can be packaged into different types of IC packages.

2. Description of Related Art

Even though conventional semiconductor memory integrated circuits(ICs) generally share the same configuration, they may have a different pad structure, depending on the form or type of IC package in which they are to be packaged.

For example, a semiconductor memory IC which is packaged into a thin small outline package (TSOP) and a semiconductor memory IC which is packaged into a ball grip array (BGA) will have a different pad arrangement from each other.

Figure 1:
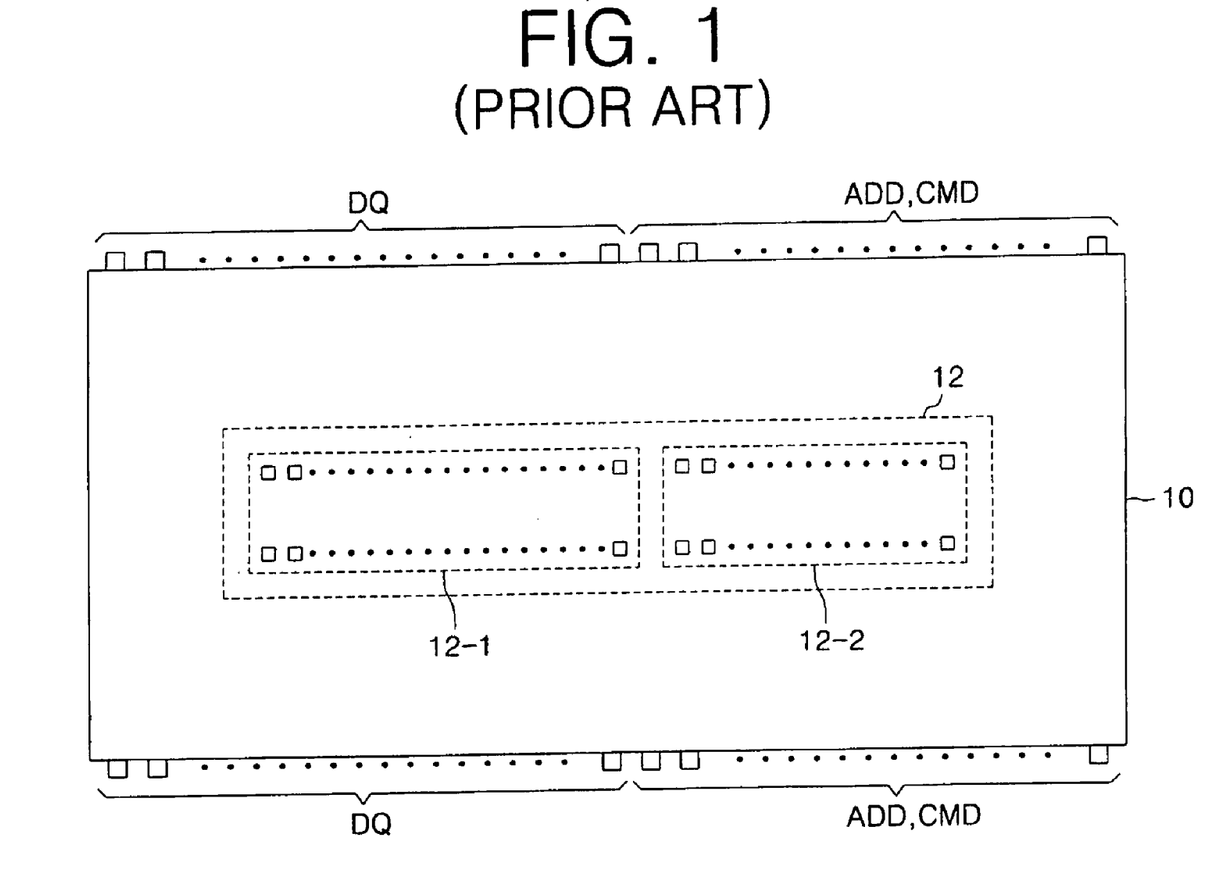
FIG. 1 shows and X16 TSOP semiconductor memory device which employs a conventional semiconductor memory integrated circuit (IC)

FIG. 1 shows an X16 TSOP semiconductor memory device which employs a conventional semiconductor memory IC.

In FIG. 1, reference numeral 10 represents a TSOP semiconductor memory device, reference numeral 12 represents a semiconductor memory IC in the TSOP semiconductor memory device, reference numeral 12-1 represents data input/output (IO) pads in the semiconductor memory IC (which can be implemented as an X36 semiconductor memory device), and reference numeral 12-2 represents address and instruction pads in the semiconductor memory IC. "DQ" represents data IO pins, and "ADD" and "CMD" represent address and instruction pins.

As can be seen in FIG. 1, pads of the semiconductor memory IC 12 of the conventional TSOP semiconductor memory device 10 are arranged on left and right sides of the data IO pads 12-1 and the address and instruction pads 12-2, respectively. Also, the corresponding data IO pins DQ, and the address and instruction pins ADD and CMD, are similarly arranged on left and right sides of the conventional TSOP semiconductor memory device 10.

Figure 2:
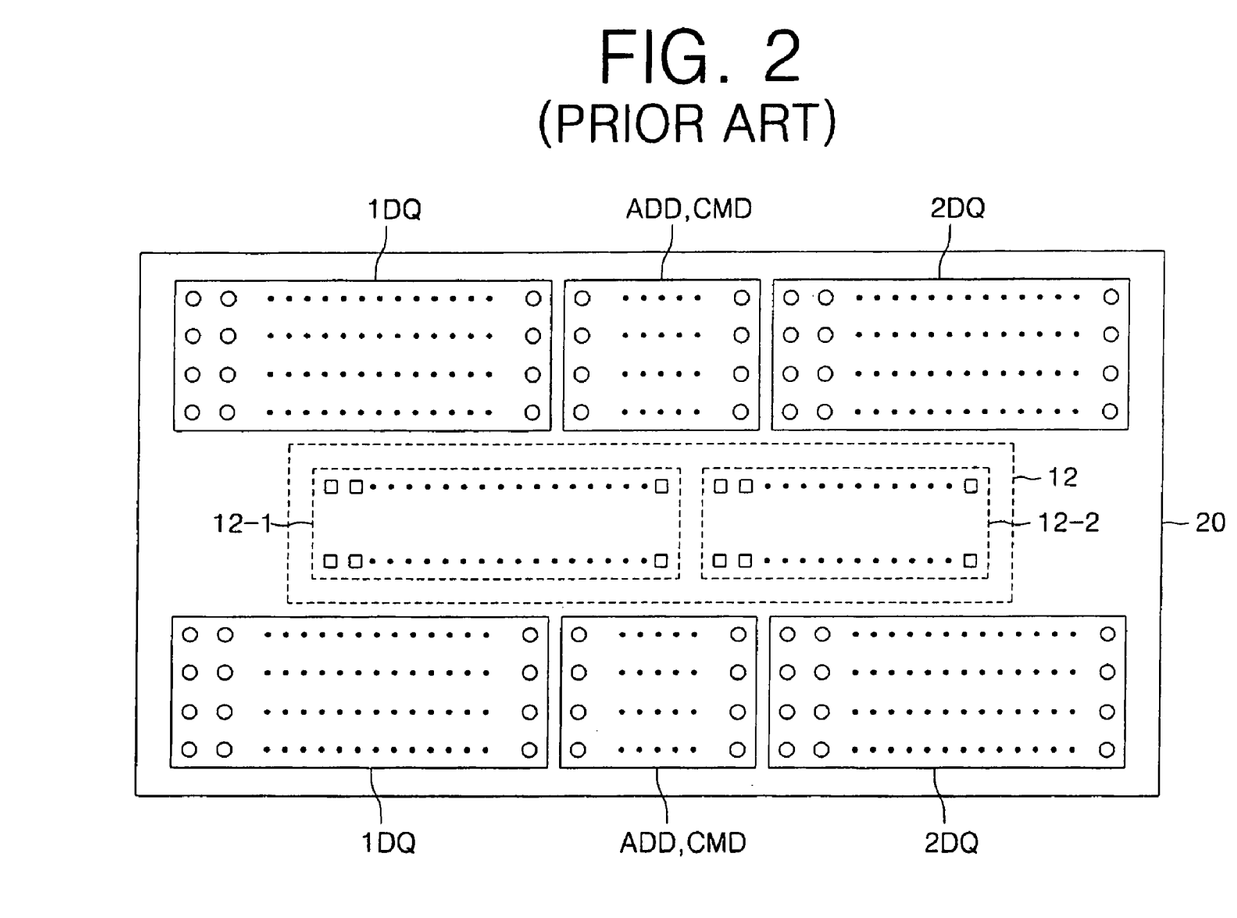
FIG. 2 shows an X36 BGA package semiconductor memory device which employs a conventional semiconductor memory IC.

FIG. 2 shows an X36 BGA package semiconductor memory device which employs a conventional semiconductor memory IC.

In FIG. 2, reference numeral 20 represents a BGA package semiconductor memory device. Like reference numerals of FIGS. 1 and 2 denote like components. "1DQ" represents first data IO (input/output) balls, "ADD" and "CMD" represent address and instruction balls, and "2DQ" represents second data IO balls.

As can be seen in FIG. 2, the first data IO balls 1DQ are positioned at a left side of the package, the address and instruction balls ADD and CMD are positioned at a central portion of the package, and the second data IO balls 2DQ are arranged at a right portion of the package. Here, of 36 data IO balls, the first data IO balls 1DQ represent 18 data IO balls, and the second data IO balls 2DQ represent the rest 18 data IO balls.

Therefore, in the case where the semiconductor memory IC having the same circuit configuration and pad arrangement as that shown in FIG. 1 is packaged into the X36 BGA package semiconductor memory device, the wire bonding process is not straightforward, because the distance between the data IO pads 12-1 and the second data IO balls 2DQ is too far, and thus failure of the semiconductor memory device is more likely due to improper wire bonding.

It is thus impossible to manufacture the semiconductor memory IC 12 to have a circuit configuration and pad arrangement that is similar in arrangement to, and therefore compatible with, the layout of both the X16 TSOP and X36 BGA semiconductor device packages. For this reason, in this example, there is a disadvantage in that a semiconductor memory IC having a pad arrangement for the X36 BGA package semiconductor memory device should be separately manufactured.

In view of the above, in a conventional semiconductor memory IC, it is difficult, if not impossible, to package a semiconductor memory IC having the same circuit configuration and pad arrangement into different types of semiconductor memory device packages having a different number of data IO pins, or a different layout of data IO pins, without the need for re-manufacturing the semiconductor memory IC.

SUMMARY OF THE INVENTION

It is therefore an object of the present invention to provide a semiconductor memory integrated circuit for packaging a given semiconductor memory IC having the same circuit configuration and pad arrangement into different package types of semiconductor memory devices.

In order to achieve the above object, a semiconductor memory integrated circuit includes a plurality of first data IO pads, a plurality of address and instruction pads, and a plurality of second data IO/address (and instruction) pads, are arranged in groups adjacent each other. Each of the plurality of the second data IO/address (and instruction) pads is used as a second data IO pad in response to a control signal when packaged into a first package form and is used as an address pad in response to the control signal when packaged into a second package form.

The semiconductor memory integrated circuit further includes, for each of the plurality of second data IO/address (and instruction) pads, a data input/address (and instruction) buffer connected to the second data IO/address (and instruction) pads to buffer data IO/address (and instruction) signals applied to the second data IO/address (and instruction) pads; a data input latch that is enabled in response to a first state of the control signal to latch and output data signals buffered by the data input/address (and instruction) buffer; an address input latch that is enabled in response to a second state of the control signal to latch and output address (and instruction) signals buffered by the data input/address (and instruction) buffer; a data output latch that is enabled in response to the first state of the control signal to latch and output internally generated data; and a data output buffer that is enabled in response to the second state of the control signal to buffer data output by the data output latch.

In one example, the first package form is a BGA package, and the second package form is a TSOP.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Reference is now made in detail to preferred embodiments of the present invention, examples of which are illustrated in the accompanying drawings.

Figure 3:
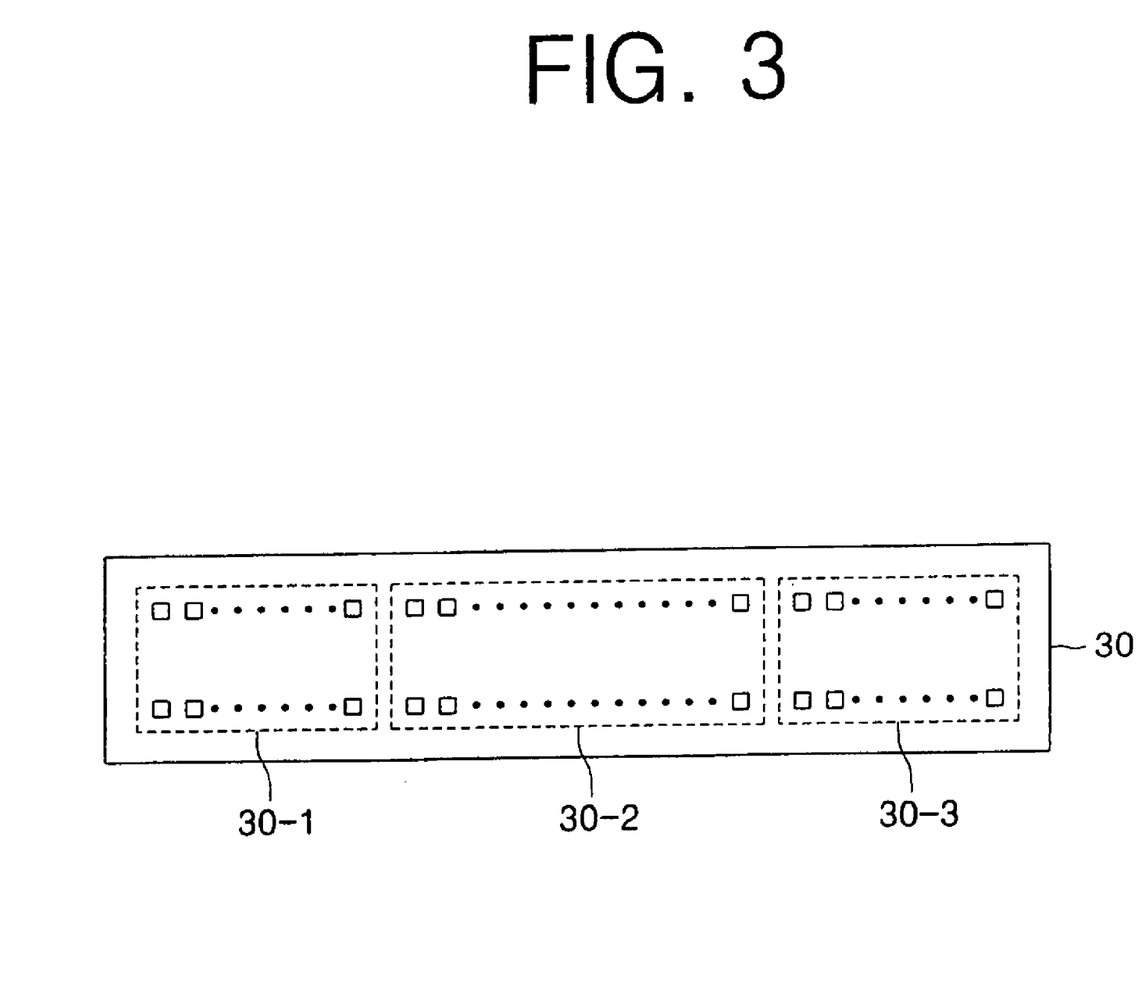
FIG. 3 shows an embodiment of pad arrangement of a semiconductor memory IC of the present invention.

FIG. 3 shows an embodiment of pad arrangement of a semiconductor memory IC of the present invention.

In FIG. 3, a reference numeral 30 represents a semiconductor memory integrated circuit (IC) having data IO pads which, as an example, can be implemented for an X36 semiconductor memory device, reference numeral 30-1 represents first data IO pads, reference numeral 30-2 represents address and instruction pads, and reference numeral 30-3 represents second data IO/address pads.

As shown in FIG. 3, the semiconductor memory IC 30 of the present invention is configured such that the first data IO pads 30-1 are arranged on the left side, the address and instruction pads 30-2 are arranged at the central portion, and the second data IO/address pads 30-3 are arranged on the right side.

Each of the second data IO/address pads arranged on a right side of the semiconductor memory IC 30 can be used as both second data IO pads and as address/instruction pads. It is noted that although the second data IO pads are referred to as "second data IO/address pads" to imply that the pads can be used for both data IO signals and address signals, these pads can also be used for command and instruction signals as well as address signals.

That is, when the semiconductor memory IC 30 is packaged into a first package type, for example the X36 BGA package semiconductor memory device, the second data IO/address pads 30-3 are used as second data IO pads, whereas when the semiconductor memory IC 30 is packaged into a second package type, for example the X16 TSOP semiconductor memory device, the second data IO/address pads 30-3 are used as the address pads.

Figure 4:
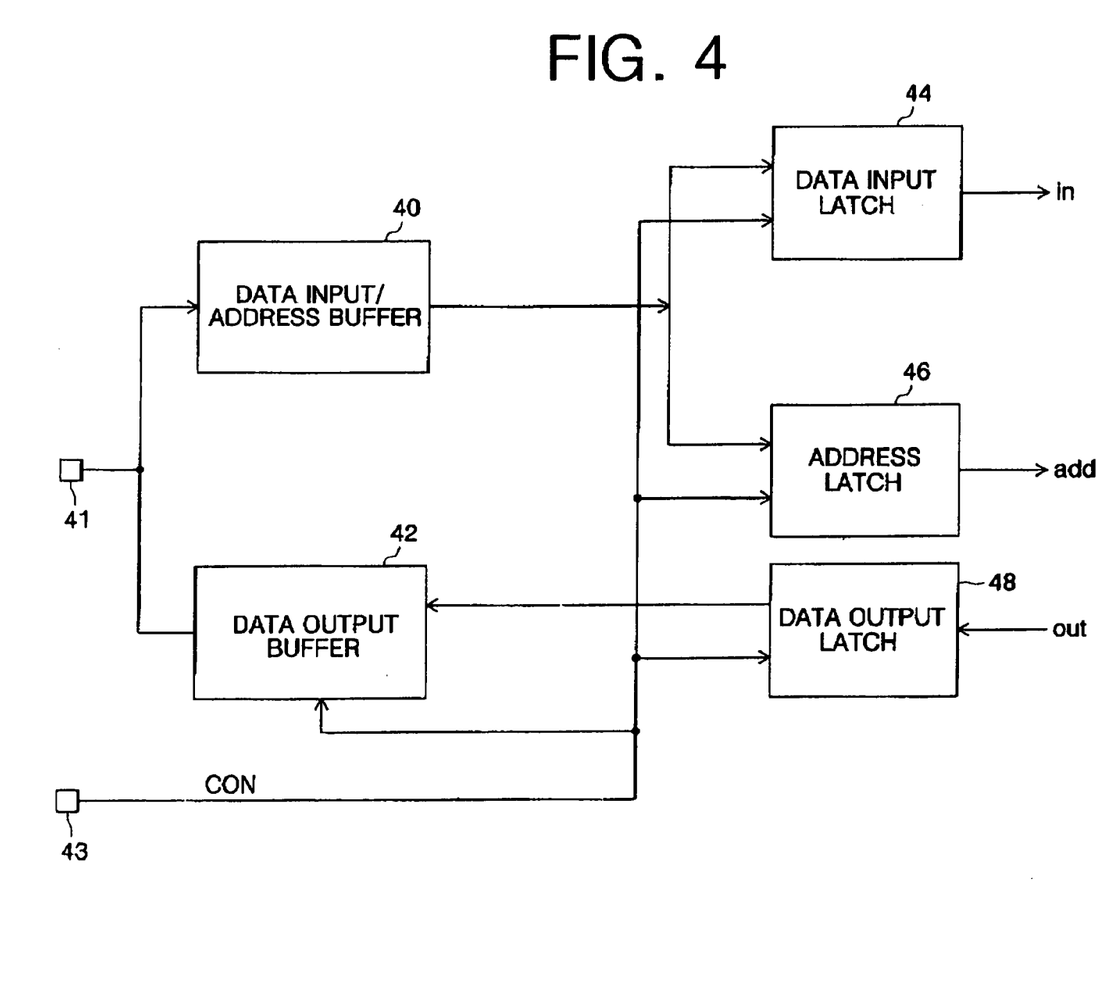
FIG. 4 is a block diagram illustrating a configuration of an address and data IO circuit which is connected to second data IO/address pads of the semiconductor memory IC of the present invention.

FIG. 4 is a block diagram illustrating a configuration of an address and data IO circuit which is connected to the second data IO/address pads 30-3 of the semiconductor memory IC of the present invention. The address and data IO circuit includes a data input/address buffer 40, a data output buffer 42, a data input latch 44, an address latch 46, and a data output latch 48.

In FIG. 4, reference numeral 41 represents one of the second data IO/address pads, and a reference numeral 43 represents a control signal CON pad. Even though not shown, the address and data IO circuits that are connected to the remainder of the second data IO/address pads 30-3 have the same configuration as that of FIG. 4.

In FIG. 4, one of the second data IO/address pads that is not connected among the pads of the semiconductor memory IC 30, can be used as the control signal CON pad.

Functions of components of the address and data IO circuit of FIG. 4 are explained below.

The data input/address buffer 42 buffers data or an address that is applied to the second data IO/address pad 41. The data output buffer 42 is enabled in response to a control signal CON to buffer data output from the data output latch 48 and then outputs the data to the second data IO/address pad 41. The data input latch 44 is enabled in response to the control signal CON to latch data output from the data input/address buffer 40 to generate an input data "in". The address latch 46 is enabled in response to the control signal CON to latch address output from the data input/address buffer 40 to generate an address "add". The data output latch 48 is enabled in response to the control signal CON to latch internally output data "out" to output the data to the data output buffer 42.

The operation of the address and data IO circuit of FIG. 4 is now explained in greater detail.

In the event that the control signal CON pad 43 is connected to a power voltage pad (not shown) of the semiconductor memory IC, a control signal CON having a "high" level is generated. In response to the control signal having a "high" level, operations of the data input latch 44, the data output buffer 42, and the data output latch 48 are enabled, and operation of the address latch 46 is disabled. Therefore, in this scenario, the second data IO/address pads 30-3 are used as second data IO.

In the event that the control signal CON pad 43 is connected to a ground voltage pad (not shown) of the semiconductor memory IC, a control signal CON having a "low" level is generated. In response to the control signal CON having a "low" level, operations of the data input latch 44, the data output buffer 42, and the data output latch 48 are disabled, and operation of the address latch 46 is enabled. Therefore, the second data IO/address pads 30-3 are used as address pads. The polarity of the CON signal (active high or active low) can be reversed, depending on circuit configuration and/or application.

Figure 5:
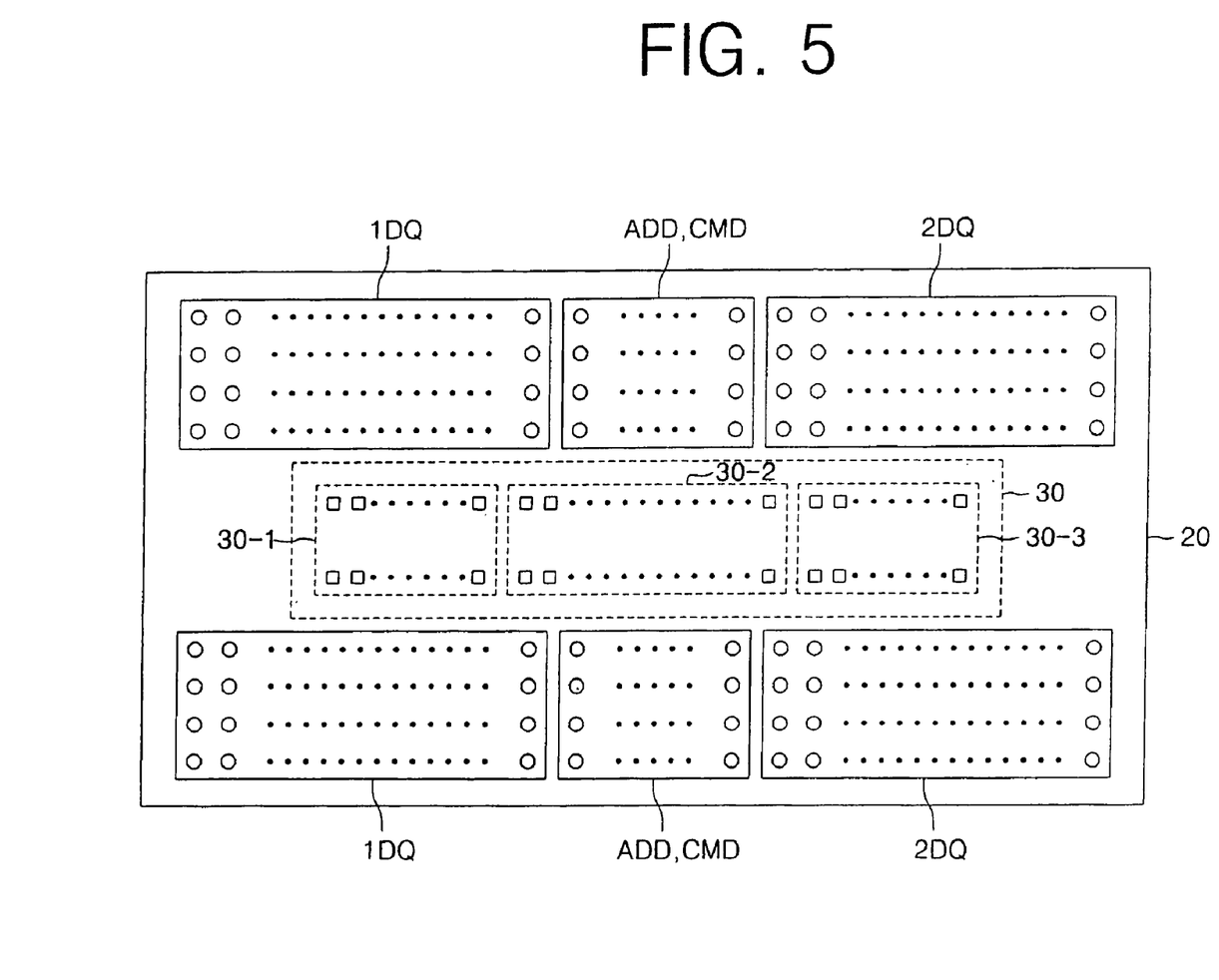
FIG. 5 shows an X36 BGA package semiconductor memory device which employs the semiconductor memory IC of the present invention.

FIG. 5 shows an X36 BGA package semiconductor memory device which employs the semiconductor memory IC of the present invention.

In FIG. 5, the X36 BGA package semiconductor memory device is of a similar form as that shown above in FIG. 2 and thus is labeled as 20. The semiconductor memory IC is the same as that of FIG. 3 and thus is labeled as 30.

In this example, the second data IO/address pads 30-2 of the semiconductor memory IC 30 of FIG. 5 are used as second data IO pads.

In FIG. 5, the first data IO pads 30-1 are wire-bonded to the first data IO balls 1DQ, and the address and instruction pads 30-2 are wire-bonded to the address and instruction balls ADD and CMD. The second data IO/address pads 30-3 are wire-bonded to the second data IO balls 2DQ.

Here, unlike the conventional semiconductor memory IC, the balls of the X36 BGA package semiconductor memory IC 20 are arranged in the same order, and thus the semiconductor memory IC 30 of FIG. 5 is relatively straightforward to wire-bond because the distance between the pads and the balls is relatively small. Therefore, the possibility of improper bonding fail is reduced, thereby decreasing the likelihood of failure of the semiconductor memory device.

Figure 6:
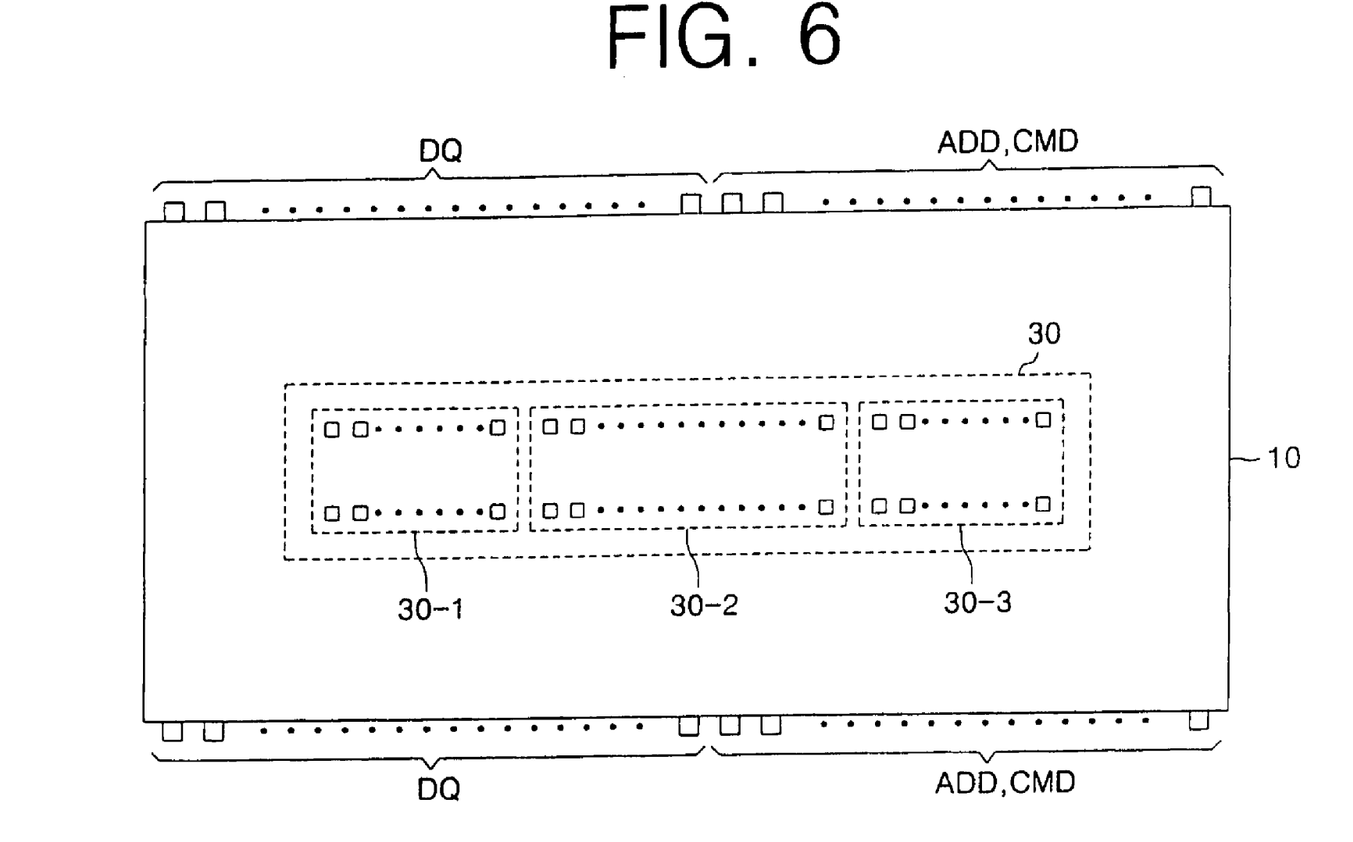
FIG. 6 shows and X16 TSOP semiconductor memory device which employs the semiconductor memory IC of the present invention.

FIG. 6 shows an X16 TSOP semiconductor memory device which employs the semiconductor memory IC of the present invention.

In FIG. 6, the X16 TSOP semiconductor memory device is the same as that of FIG. 1 and thus is labeled as 10, and the semiconductor memory IC is the same as that of FIG. 3 and thus is labeled as 30.

The second data IO/address pads 30-3 of the semiconductor memory IC 30 of FIG. 6 are used as address pads.

In FIG. 6, the first data IO pads 30-1 are wire-bonded to the data IO pins DQ, and the second data IO/address pads 50-3 are wire-bonded to the address and instruction pins ADD and CMD. In this example, the, the address and instruction pads of the semiconductor memory IC 30 are not connected to the address and instruction pins of the semiconductor memory device.

In this example, the first data IO pads 30-1 of the semiconductor memory IC 30 are close in proximity to the data IO pins DQ of the device package 10, and thus the pads 30-1 and the pins DQ are wire-bonded to each other. Since the address and instruction pads 30-2 of the semiconductor memory IC 30 are relatively distant from the address and instruction pins ADD and CMD of the device package 10, the pads 30-2 and the pins ADD and CMD are not wire-bonded. Instead, the second data IO/address pads 30-3 and the address and instruction pins ADD and CMD of the package are wire-bonded.

Meanwhile, in the case where the instruction pins of the address and instruction pins ADD and CMD and instruction pads of the address and instruction pads 30-2 are relatively close in proximity, the instruction pins can be wire-bonded to the instruction pads 30-2 instead of the second data IO/address pads 30-3.

Therefore, the semiconductor memory IC 30 of the present invention is relatively easy to wire-bond, even when it is packaged into different semiconductor device packages, for example the X36 BGA or the X16 TSOP semiconductor memory device, and therefore the possibility of failure of the device resulting from erroneous wire bonding is reduced.

In the example provided above, the semiconductor memory IC can receive or output 36 bits of data and thus is packaged into the X36 BGA package semiconductor memory device and the X16 TSOP semiconductor memory device. However, in other examples the semiconductor memory IC of the present invention can be packaged into X18 and X9 BGA package semiconductor devices and X8 and X4 TSOP semiconductor memory devices.

Accordingly, if the semiconductor memory IC is designed to receive or output 72 bits of data, it can be packaged into X72, X36, X18, and X9 BGA package semiconductor devices and X32, X16, X8, and X4 TSOP semiconductor memory devices, for example.

In addition, although the above example allows for selectivity over the operation of the bonding pads (in this example, as data IO pads or address/instruction pads) or the second data IO pads 30-3, that same selectivity can be applied to other regions of the memory device, for example in the address and instruction pads 30-2, or in the first data IO pads 30-1, or in selected portions of each region of pads.

Therefore, the semiconductor memory IC of the present invention can selectively use a portion of its pads as data IO pads or address and instruction pads, and thus the IC can be packaged into different form of packages.

Also, the semiconductor memory IC is relatively easy to wire bond when it is packaged into different forms of packages, and thus the likelihood of failure of the semiconductor memory device is reduced.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor memory integrated circuit, comprising:
   a plurality of first data IO pads, a plurality of address and instruction pads, and a plurality of second data IO/address pads, which are arranged in groups adjacent each other,
   wherein the plurality of first data IO pads are adjacent to a first side of the plurality of the address and instruction pads and the plurality of second data IO/address pads are adjacent to a second side of the plurality of address and instruction pads opposite the first side, and wherein each of the plurality of the second data IO/address pads is used as a second data IO pad in response to a control signal when packaged into a first package form and is used as an address pad in response to the control signal when packaged into a second package form.

2. The circuit of claim 1, further comprising, for each of the plurality of second data IO/address pads:
   a data input/address buffer connected to the second data IO/address pad to buffer data IO/address signals applied to the second data IO/address pad;
   a data input latch that is enabled in response to a first state of the control signal to latch and output data signals buffered by the data input/address buffer;
   an address input latch that is enabled in response to a second state of the control signal to latch and output address signals buffered by the data input/address buffer;
   a data output latch that is enabled in response to the first state of the control signal to latch and output internally generated data; and
   a data output buffer that is enabled in response to the second state of the control signal to buffer data output by the data output latch.

3. The circuit of claim 1, wherein the first package form is a BGA package.

4. The circuit of claim 1, wherein the second package form is a TSOP package.

5. A semiconductor memory integrated circuit, comprising:
   a plurality of data IO pads, a plurality of address and instruction pads, and a plurality of generic pads, which are arranged in groups adjacent each other,
   wherein the plurality of data IO pads are adjacent to a first side of the plurality of the address and instruction pads and the plurality of generic pads are adjacent to a second side of the plurality of address and instruction pads opposite the first side, and wherein each of the plurality of generic pads is used as a data IO pad in response to a control signal when packaged into a first package form and is used as an address pad in response to the control signal when packaged into a second package form.

6. The circuit of claim 5 further comprising, for each of the plurality of the generic pads:

a data input/address buffer connected to the generic pad to buffer a data IO/address signal applied to the generic pad;

a data input latch that is enabled in response to a first state of the control signal to latch and output a data signal buffered by the data input/address buffer;

an address input latch that is enabled in response to a second state of the control signal to latch and output an address signal buffered by the data input/address buffer;

a data output latch that is enabled in response to the first state of the control signal to latch and output internally generated data; and a data output buffer that is enabled in response to the second state of the control signal to buffer data output by the data output latch.

7. The circuit of claim 5 wherein the first package form is a BGA package.

8. The circuit of claim 5 wherein the second package form is a TSOP package.

9. A semiconductor memory integrated circuit, comprising:

a plurality of data IO pads, a plurality of address and instruction pads, and a plurality of generic pads, which are arranged in groups adjacent each other, wherein each of the plurality of the generic pads is used as a data IO pad in response to a control signal when packaged into a first package form and is used as an address or instruction pad in response to the control signal when packaged into a second package form.

10. The circuit of claim 9 further comprising, for each of the plurality of the generic pads:

a data input/address and instruction buffer connected to the generic pad to buffer data IO/address and instruction signals applied to the generic pad;

a data input latch that is enabled in response to a first state of the control signal to latch and output a data signal buffered by the data input/address and instruction buffer;

an address input latch that is enabled in response to a second state of the control signal to latch and output an address and instruction signal buffered by the data input/address and instruction buffer;

a data output latch that is enabled in response to the first state of the control signal to latch and output internally generated data; and a data output buffer that is enabled in response to the second state of the control signal to buffer data output by the data output latch.

11. The circuit of claim 9 wherein the first package form is a BGA package.

12. The circuit of claim 9 wherein the second package form is a TSOP package.

13. A semiconductor memory integrated circuit, comprising:

a plurality of first data IO pads, a plurality of address and instruction pads, and a plurality of second data IO/address pads, which are arranged in groups adjacent each other, wherein each of the plurality of the second data IO/address pads is used as a second data IO pad in response to a control signal when packaged into a first package form and is used as an address pad in response to the control signal when packaged into a second package form, the circuit further comprising, for each of the plurality of second data IO/address pads:

a data input/address buffer connected to the second data IO/address pad to buffer data IO/address signals applied to the second data IO/address pad;

a data input latch that is enabled in response to a first state of the control signal to latch and output data signals buffered by the data input/address buffer;

an address input latch that is enabled in response to a second state of the control signal to latch and output address signals buffered by the data input/address buffer;

a data output latch that is enabled in response to the first state of the control signal to latch and output internally generated data; and a data output buffer that is enabled in response to the second state of the control signal to buffer data output by the data output latch.

14. The circuit of claim 13 wherein the first package form is a BGA package and the second package form is a TSOP package.

15. A semiconductor memory integrated circuit, comprising:

a plurality of data IO pads, a plurality of address and instruction pads, and a plurality of generic pads, which are arranged in groups adjacent each other, wherein each of the plurality of generic pads is used as a data IO pad in response to a control signal when packaged into a first package form and is used as an address pad in response to the control signal when packaged into a second package form, the circuit further comprising, for each of the plurality of the generic pads:

a data input/address buffer connected to the generic pad to buffer a data IO/address signal applied to the generic pad;

a data input latch that is enabled in response to a first state of the control signal to latch and output a data signal buffered by the data input/address buffer;

an address input latch that is enabled in response to a second state of the control signal to latch and output an address signal buffered by the data input/address buffer;

a data output latch that is enabled in response to the first state of the control signal to latch and output internally generated data; and a data output buffer that is enabled in response to the second state of the control signal to buffer data output by the data output latch.

16. The circuit of claim 15 wherein the first package form is a BGA package and the second package form is a TSOP package.

* * * * *